United States Patent [19]

Benavides et al.

[11] Patent Number: 5,254,871
[45] Date of Patent: Oct. 19, 1993

[54] VERY LARGE SCALE INTEGRATED CIRCUIT PACKAGE, INTEGRATED CIRCUIT CARRIER AND RESULTANT INTERCONNECTION BOARD

[75] Inventors: Eric Benavides, Bagneux; Agnes Guilhot, Angers, both of France

[73] Assignee: Bull, S.A., Paris, France

[21] Appl. No.: 520,546

[22] Filed: May 8, 1990

Related U.S. Application Data

[63] Continuation of Ser. No. 433,265, Nov. 8, 1989, abandoned.

[30] Foreign Application Priority Data

Nov. 8, 1988 [FR] France .................................. 88 14542

[51] Int. Cl.⁵ ...................... H01L 23/02; H01L 23/12
[52] U.S. Cl. .................................... 257/666; 257/668; 257/690; 257/692; 257/700; 361/820; 174/52.4
[58] Field of Search ......................... 357/70, 74, 80, 84; 361/421; 174/52.4; 257/666, 668, 690, 691, 692, 693, 700

[56] References Cited

U.S. PATENT DOCUMENTS

| | | | |
|---|---|---|---|
| 3,908,185 | 9/1975 | Martin | 357/74 |
| 4,922,324 | 5/1990 | Sudo | 357/74 |
| 4,953,007 | 8/1990 | Erdos | 357/84 |
| 4,975,761 | 12/1990 | Chu | 357/72 |

FOREIGN PATENT DOCUMENTS

| | | | |
|---|---|---|---|
| 0331289 | 9/1989 | European Pat. Off. | 357/84 |
| 0086144 | 6/1980 | Japan | 357/84 |
| 0045975 | 2/1990 | Japan | 357/84 |

Primary Examiner—Rolf Hille
Assistant Examiner—David Ostrowski
Attorney, Agent, or Firm—Kerkam, Stowell, Kondracki & Clarke

[57] ABSTRACT

The package (10) of the integrated circuit (11) includes a TAB carrier (12), the supply conductors (15b) of which comprise shielding elements between groups of signal conductors and have a length that is largely shunted via a corresponding potential conductor plane (26b) of the decoupling device (24) of the package.

22 Claims, 3 Drawing Sheets

VERY LARGE SCALE INTEGRATED CIRCUIT PACKAGE, INTEGRATED CIRCUIT CARRIER AND RESULTANT INTERCONNECTION BOARD

CONTINUING DATA

This application is a continuation of Ser. No. 433,265 filed Nov. 8, 1989, now abandoned.

FIELD OF THE INVENTION

The subjects of the invention are a package very large scale integrated circuit or VLSI chip, a TAB (tape-automated bonding) carrier for the integrated circuit adapted to the package, and an interconnection board intended to receive such a package.

BACKGROUND OF THE INVENTION

Ordinary, currently used integrated circuits are substantially square semiconductor wafers approximately 1 cm on a side and capable of carrying up to 500 peripheral terminals. The TAB carrier of such an integrated circuit includes an insulating substrate carrying a plurality of radiating leads, known as a TAB lead frame. Ordinarily the substrate is made of a flexible plastic material, such as that known by the registered trademark Kapton, and is composed of one or more concentric frames. The leads of the carrier converge toward a central region of the substrate so as to be connected to the input/output terminals of the integrated circuit, in an operation known as ILB or inner lead bonding, ordinarily consisting in welding by thermocompression. The TAB carrier of an integrated circuit is typically cut from a film of the cinematography type, known as TAB film, that includes a longitudinal series of TAB lead frame, with holes along the edge for displacing and positioning the film.

One current problem in encapsulating a VLSI chip in a package relates to supplying energy to the chip. The supply potentials are ground, and ordinarily one or two different predetermined values. During chip operation, these potentials must remain stable despite the various values in intensity of the current required by the circuits called upon to function in the integrated circuit. As a result, the supply leads function as electrical transmission lines, having a reactive self-induction component in response to the variations in current. The self-induction component of each lead is accordingly proportional to its length. On the other hand, the present supply current intensity is high. For example, certain integrated circuits can instantaneously dissipate up to 6 watts at a voltage of up to 3 volts, thus requiring a flow of 2 amps. Considering the great density of the terminals of the chip, the leads must be narrow and quite close to one another. The flow of high-intensity supply current must accordingly take place in a plurality of supply leads. Moreover, the small cross sections of the leads increase their ohmic resistance.

The solution currently adopted comprises applying the supply potentials to respective solid terminals that are outside the package and are connected inside it to various potential conductor planes. The potential planes are associated with separate decoupling capacitors incorporated in the package, or form the plates of a decoupling capacitor. They are connected to the corresponding supply leads in the closest part of the integrated circuit. The length of the supply leads is thus reduced approximately to the length separating the supply terminals of the integrated circuit from the neighboring potential planes. This solution thus has the advantage of lowering the ohmic impedance and the reactive self-induction component of the supply circuit in the package. In the end, in fact, only the signal leads are long and extend over the entire carrier for connection to outside the package.

Using TAB carriers with short supply leads and long signal leads presents the problem in practice of signal interference circulating in the neighboring leads. In effect, on a high-density TAB carrier two large neighboring signal leads are substantially parallel and very close to one another (50 to 100 μm apart) and comprise two electrical lines interacting with one another. One solution would be to distribute the signal leads in a plurality of groups insulated from one another by fixed potential conductors, such as the supply conductors. However, lengthening the supply leads to make electromagnetic shielding elements between two adjacent groups of signal leads would again present the problem of the reactive self-induction component of these long supply leads.

OBJECT AND SUMMARY OF THE INVENTION

The invention provides a solution to this problem, with the resultant advantage that both a reduced self-induction component and effective shielding between signal leads are obtained.

A package according to the invention for a very large scale integrated circuit, or VLSI chip, including supply potential planes external to and parallel to the integrated circuit and a TAB lead frame provided with long signal leads and a plurality of supply leads connected in proximity with the integrated circuit on the interior periphery of the respective potential planes, is characterized in that the supply leads of at least a portion of the plurality are also connected to the outer periphery of the respective potential planes and are disposed among the signal leads to serve as shielding elements between groups of signal leads.

A TAB carrier of a very large scale integrated circuit, or VLSI chip, for use in the package, including a substrate concentric to the integrated circuit, carrying a TAB lead frame and pierced on its inner periphery under a plurality of leads of said lead frame, is characterized in that the substrate is also pierced on its outer periphery under the leads of at least a portion of the plurality, and that the leads of that portion are distributed substantially uniformly among the leads outside the plurality.

The result is also an interconnection board according to the invention for connection of the above package, incorporating potential planes and a signal interconnect system, and having on one face supply terminals for connection of the potential planes of the package and a ring of zones intended for connection of the TAB lead frame of the package to the signal interconnect system of the board, characterized in that the ring includes connection zones connected to the potential planes of the board.

The characteristics and advantages of the invention will become apparent from the ensuing description given by way of example, taken in conjunction with the drawings.

DESCRIPTION OF THE PREFERRED EMBODIMENTS

Figure 1:
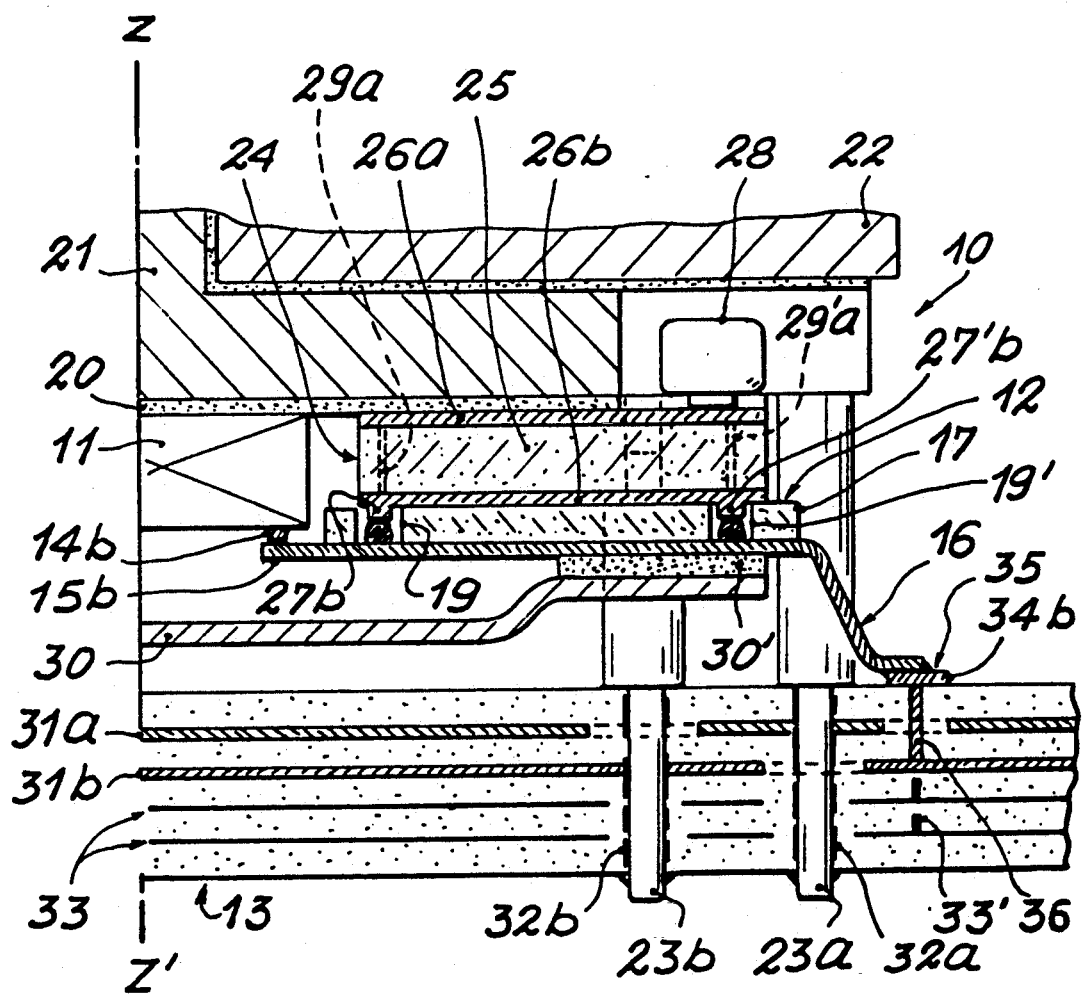
FIG. 1 is a half view in fragmentary axial section of a package according to the invention for a very large scale integrated circuit, the package including a TAB chip carrier according to the invention and being mounted on an interconnection board adapted to the package.
Figure 2:
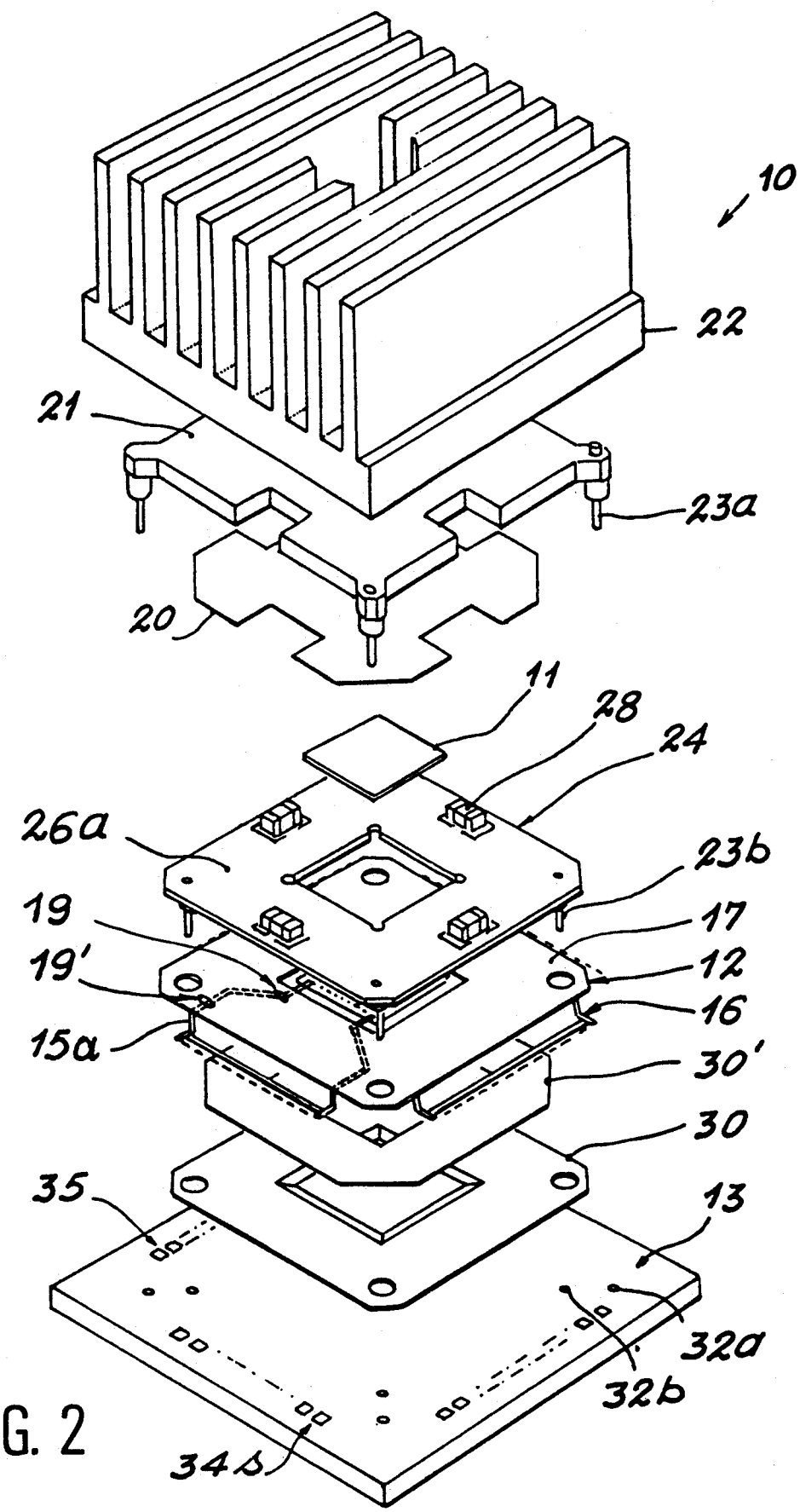
FIG. 2 is an exploded perspective view of the package and board shown in FIG. 1.
Figure 3:
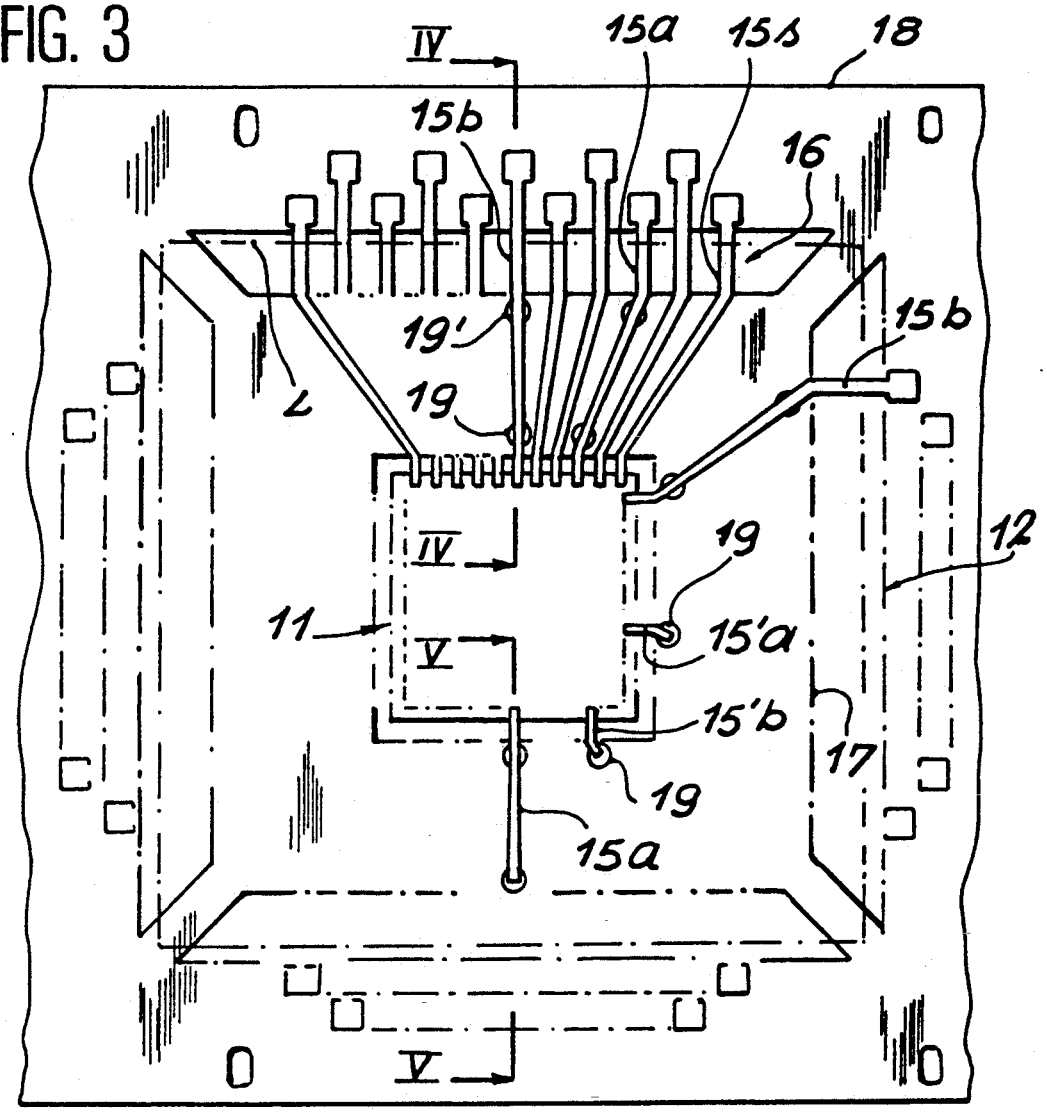
FIG. 3 is a schematic fragmentary plan view of a TAB film according to the invention, from which the TAB carrier of the chip incorporated in the package shown in FIGS. 1 and 2 has been taken.
Figure 4:
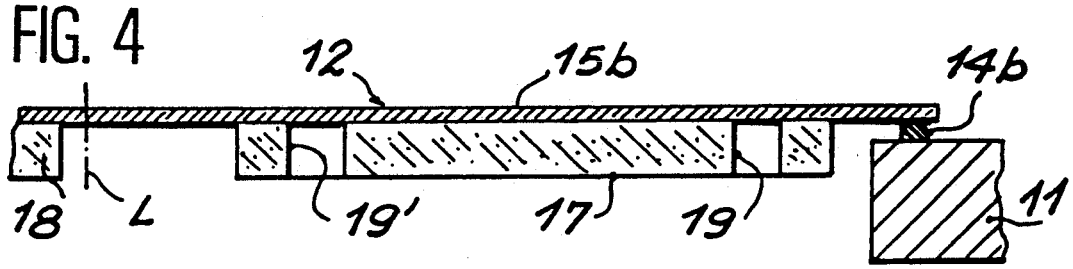
FIGS. 4 and 5, respectively, are sectional views along the lines IV—IV and V—V of the TAB film shown in FIG. 3.
Figure 5:
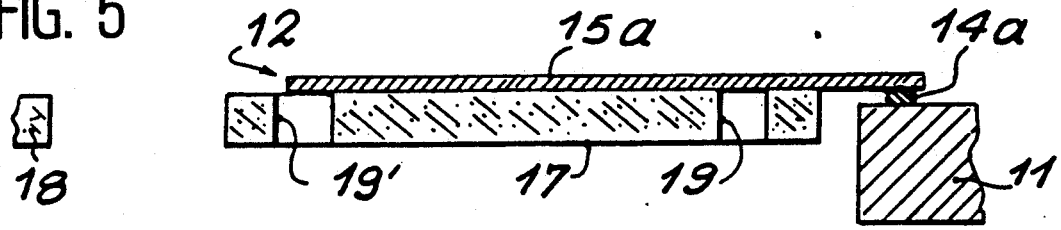

FIGS. 1 and 2 show the preferred embodiment according to the invention of a package 10 for an integrated circuit or chip 11 mounted on a TAB carrier 12. The package 10 shown in FIG. 1 is a half view, in medial and axial section taken along the axis ZZ' passing perpendicularly to the chip 11 at its center. It is also shown in its final position in being mounted on an interconnection board 13, shown schematically and fragmentarily in the form of a printed wiring board. FIGS. 3, 4 and 5 illustrate exemplary embodiments according to the invention of the TAB carrier 12 included in the package 10.

Turning now to FIGS. 3, 4 and 5, the chip 11 has peripheral input/output terminals 14 on its active face, which are generally disposed in a line or in a zig-zag pattern. The terminals 14 are divided into signal terminals 14s (not visible in the drawings) and supply terminals 14a, 14b, corresponding respectively to two supply potentials Ua and Ub; Ua=0 V (ground) and Ub= +3 V. The terminals 14 are affixed to the inner ends of respective conductors (leads) 15 assembled in a bundle (TAB lead frame) 16 on one face of a flexible, electrically insulating substrate 17. A distinction can be made between the signal leads 15s affixed to the signal terminals 14s, long supply leads 15a, 15b originating at respective supply terminals 14a, 14b, and short supply terminals 15'a, 15'b affixed respectively to the other supply terminals 14a, 14b of the chip 11. The substrate 17 shown is embodied as a single frame for the sake of simplicity in the drawing, but it is understood that in practice it typically comprises a plurality of frames concentric to the axis ZZ' of the chip 11. The TAB carrier 12 has been cut from a TAB film 18 along the line L indicated by a dot-dash line. On a conventional carrier, only the signal leads 15s are extended as far as the film 18 and are cut along the line L, since the supply leads are very short, like the leads 15'a and 15'b shown in FIG. 3. In general, the supply leads 15'a and 15'b come to an end in proximity with the chip 11, on the inner periphery of the frame 17 of the substrate. In the example illustrated in FIG. 3, the short leads 15'a, 15'b come to an end at the level of holes 19 made in the inner periphery of the frame 17, and the long leads 15a, 15b extend to the level of similar holes 19 made in the inner periphery of the frame 17. The TAB carrier 12 is thus adapted to the particular embodiment of the package 10 that will now be described.

In the package 10 shown in FIGS. 1 and 2, the integrated circuit 11 has its base fixed via a conductive seal 20 to a fixed connector or plate 21 made of an electrically and thermally conductive material, such as copper or aluminum. The fixed connector 21 is a substantially square, small rigid plate coaxial with the axis ZZ' and provided with a coaxial column for the fixation of a heat sink 22. The corners of the fixed connector 21 extend along its diagonals to form four support arms for four supply terminals 23a comprising the conductor pegs perpendicular to the fixed connector. The package 10 includes a decoupling device 24 comprising an insulating frame 25 provided on both faces with two respective conductor planes 26a, 26b linked with corresponding conductor islets 27a, 27b and linked with four capacitors 28. The decoupling device 24 coaxially surrounds the chip 11. The conductor plane 26a is fixed to the fixed connector 21 via the seal 20, extended appropriately. On the other side, the conductor plane 26b is linked with four supply terminals 23b formed of pegs affixed to the four sides of the frame 25. The substrate 17 of the TAB carrier 12 rests against the conductor plane 26b. The islets 27a, 27b are disposed on the inner periphery of the frame 25, corresponding with the holes 19 in the substrate 17 in order to be in contact with the respective supply leads 15a, 15b, 15'a, 15'b of the TAB lead frame 16. In practice, the islets 27b are extensions of the conductor plane 26b, and the islets 27a are put in communication with the conductor plane 26a by way of vias 29a passing through the frame 25. The package 10 is closed with a cap 30, advantageously made of a conductive material and fixed mechanically and electrically to the pegs 23b, while being insulated from the spider 16 by a seal 30'.

The interconnection board 13 to which the package 10 is to be applied is composed of two conductor planes 31a, 31b connected respectively to the supply potentials Ua and Ub, metallized holes 32a, 32b linked to the conductor planes 31a, 31b and the supply pegs 23a, 23b, respectively, of the package 10, and a signal interconnect system 33 formed of conductive layers such as the two layers represented by a solid line in FIG. 1 and connection zones 34s aligned in a ring 35 concentric to the axis ZZ' and placed in correspondence with the outer ends of the signal leads 15s of the TAB lead frame 16 of the package 10. The connection zones 34s are connected to the signal interconnect system 33 by conductive vias 33'.

In one characteristic of the invention, at least a portion of the set of supply leads of the TAB lead frame 16 comprises of long supply leads 15a, 15b connected both to the peripheral inner islets 27a, 27b of the decoupling device 24 of the package 10 and to the outer peripheral islets 27'a, 27'b of the decoupling device 24. In the TAB carrier 12 shown in FIG. 3 and mounted in the package 10 of FIG. 1, short supply leads 15a, 15b remain, and the long supply leads 15a, 15b come to the level of holes 19' made in the outer periphery of the substrate 17 of the TAB carrier 12. The outer peripheral islets 27'b are extensions of the potential plane 26b, and the islets 27'a are connected to the potential plane 26a by respective vias 29'a passing through the frame 25. The connection of the supply leads in the holes 19, 19' is preferably made by tin-lead soldering to the corresponding islets 27a, 27'a, 27b, 27'b that are raised relative to the conductor plane 26b.

FIG. 4 is a fragmentary sectional view on a larger scale of the film 18 shown in FIG. 3, which is used in the manufacture of the package shown in FIG. 1. In this embodiment, the supply leads 15a, 15b are extended in the same manner as the signal leads 15s of the TAB lead frame 16. In this case, the outer ends of the TAB lead frame 16 of the package 10 are connected to corresponding zones 34a, 34b of the board 13. The zones 34a, 34b are distributed among the signal zones 34s in the ring 35. The zones 34a, 34b are connected to the respective potential planes 31a, 31b by way of conductive vias 36.

In another characteristic of the invention, the elongated supply leads 15a, 15b are disposed among the signal leads 15s, to serve as electromagnetic shielding elements between groups of signal leads. As shown in correspondence with the top face of the chip 11 shown in FIG. 3, one elongated supply conductor 15a or 15b separates two adjacent groups of signal leads. For the same of clarity in the drawing, the groups shown are composed of only two signal leads. In practice, each group will of course comprise a larger number of signal leads 15s, and this number may easily vary between adjacent groups.

In conclusion, the elongation of the supply leads 15a, 15b in a TAB lead frame 16 and their connection to the inner and outer periphery of the conductor planes 26a, 26b surrounding the chip 11 solves the problem of electromagnetic shielding between groups of signal leads 15s. It is understood that a single long supply lead 15a or 15b has a greater self-induction. Thanks to the invention, the majority of the length of the elongated lead is shunted along a conductor plane having negligible self-induction. In addition, the total self-induction of the set of long supply leads 15a, 15b has the self-induction value of a long lead shunted in accordance with the invention, divided by the total number of long leads. It follows, finally, that in a package 10 according to the invention the total self-induction of the supply circuit is substantially the same as that of a conventional package.

The embodiment shown in FIGS. 1, 2, 3, 4 and 5 may be modified variously according to the invention. In particular, the short supply leads 15'a, 15'b in the lead frame 16 shown in FIG. 3 may be eliminated, so that the set of supply leads is extended to serve as shielding elements between groups of signal leads 15s. On the other hand, the lengthening of the supply leads may be limited to their peripheral connection outside the islets 27'a, 27'b with the conductor planes 26a, 26b of the package 10. This variant is represented in FIG. 5. It is understood that the variants may coexist in one and the same lead frame.

In addition, the embodiment of the package 10 shown in FIGS. 1 and 2 requires piercing holes 19 and 19' in the substrate 17 of the TAB carrier 12 for connection of the supply leads with the respective conductor planes of the decoupling device in the package. However, for other configurations of the decoupling device in a VLSI chip package, in which the islets 27a, 27b and 27'a, 27'b are on the same face, electrically insulated and remote from the conductor planes 26a and 26b, the TAB lead frame 16 could be applied directly to this face, with the substrate 17 placed toward the cap 30. Consequently, the connection of the islets with the long corresponding supply leads can be done directly, without requiring the piercing of holes in the substrate 17. Moreover, it is understood that a set of holes 19 or 19' may be replaced with a slit, made for example in each side of the substrate 17. The set of holes 19 or 19' may optionally be formed by the space between two adjacent frames dividing the substrate 17. Accordingly, the phrase "piercing of holes under the supply leads" is a term that includes these extensions. For these extensions the holes then extend under the signal leads.

What is claimed is:

1. An integrated circuit package (10) comprising an integrated circuit (11) having terminals (14a, 14b, 14s), at least one potential plane, said integrated circuit and said at least one potential plane being adapted to be connected to a power supply potential, and a lead frame (16) comprising first (15a, 15b) and second (15s) pluralities of leads having inner end portions respectively connected to said terminals of the integrated circuit and outer end portions, wherein each of the first plurality of said leads (15a, 15b) has both said inner and said outer end portions connected to said potential plane.

2. The package as defined by claim 1, wherein each lead of said first plurality is disposed adjacent at least one of the second plurality of leads (15s).

3. The package as defined by claim 1, wherein said potential plane has at least a portion extending parallel to said lead frame between said inner and outer end portions of said leads.

4. The package as defined by claim 3, further comprising an insulating substrate (17) inserted between said lead frame and said potential plane (26b) and having through holes (19, 19') for respective connection of said inner and outer end portions of said leads with said potential plane.

5. The package as defined by claim 3, further comprising insulating plate means (15) having a face supporting said potential plane (26a) and the opposite face facing said lead frame and having inner conducting islets (27a) and outer conducting islets (27'a) both connected to said potential plane through conductive vias (29a, 29'a) in said insulating plate means, and an insulating substrate (17) inserted between said lead frame and said opposite face of the insulating plate means and having through holes (19, 19') for respective connection of said inner and outer end portions of said leads with said inner and outer conducting islets.

6. The package as defined by claim 1, wherein said lead frame is a TAB lead frame.

7. The package as defined by claim 4, wherein said lead frame is a TAB lead frame having said leads supported by said insulating substrate.

8. The package as defined by claim 5, wherein said lead frame is a TAB lead frame having said leads supported by said insulating substrate.

9. The package as defined by claim 6 further comprising outer terminals for external connection, wherein said outer terminals are the respective outer ends of said first and second plurality of leads.

10. The package as defined by claim 9, further comprising supply conductor means (23a, 23b) having an end connected to said potential plane and an outer end for external connection.

11. The package as defined by claim 6 further comprising outer terminals for external connection, wherein said outer terminals are the respective outer ends of said second plurality of leads (15s).

12. The package as defined by claim 1, wherein said lead frame further comprises a third plurality of leads (15'a, 15'b) having inner end portions connected to corresponding terminals of the integrated circuit and outer end portions extending to the level of said inner end portions of said first and second plurality of leads and connected to the potential plane.

13. A TAB carrier (12) comprising a lead frame (16) comprising first and second pluralities of leads (15a, 15b, 15s) having inner end portions adapted to be connected to an integrated circuit (11) and outer end portions and an insulating substrate (17) supporting the lead frame and having through holes (19, 19') located under said inner and outer end portions of said first plurality of leads (15a, 15b), whereby said inner and outer end portions of said first plurality of leads are adapted to be connected to a potential plane through said through holes.

14. The carrier as defined by claim 13, wherein each lead of said first plurality is disposed adjacent at least one of the second plurality of leads (15s).

15. The carrier as defined by claim 13, wherein the lead frame further comprises a third plurality of leads (15'a, 15'b) having inner end portions adapted to be connected to the integrated circuit and outer end portions extending to the level of said inner end portions of said first and second plurality of leads, and the substrate further comprises through holes (19) located under said outer end portions of the third plurality of leads.

16. The carrier as defined by claim 13, wherein said first plurality and said second plurality of leads have outer ends extending beyond the substrate.

17. The carrier as defined by claim 13, wherein said second plurality of leads (15c) have outer ends extending beyond the substrate.

18. A device (10, 13) comprising:
a package (10) comprising an integrated circuit (11), outer terminals and supply conductor terminals (23a, 23b), a lead frame (16) comprising leads (15a, 15b, 15s) connecting said integrated circuit to said outer terminals and having inner end portions and outer end portions, and potential planes (26a, 26b) connected to said inner and outer end portions of a first plurality of the leads (15a, 15b) and to said supply conductor terminals; and
an interconnection board (13) having first terminals (34a, 34b, 34s) connected to said outer terminals of the package, second terminals (32a, 32b) connected to said supply conductor terminals, and potential planes (31a, 31b) connected to said second terminals and a plurality (34a, 34b) of said first terminals corresponding to said first plurality of leads.

19. The carrier as defined by claim 18, wherein each lead of said plurality of leads is disposed adjacent at least one lead (15s) which is not a member of said first plurality.

20. The carrier as defined by claim 18, wherein said lead frame is a TAB lead frame.

21. The carrier as defined by claim 18, wherein the lead frame is a TAB lead frame and said outer terminals of the package are the respective outer ends of the leads which are not members of said first plurality of leads.

22. The carrier as defined by claim 18, wherein the lead frame is a TAB lead frame and said outer terminals of the package are the respective outer ends of said leads.

* * * * *